(12) United States Patent
Ko et al.

(10) Patent No.: US 7,185,241 B2
(45) Date of Patent: Feb. 27, 2007

(54) DEINTERLEAVING APPARATUS AND METHOD FOR A DIGITAL COMMUNICATION SYSTEM

(75) Inventors: Jun-won Ko, Seoul (KR); Suk-jin Jung, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 507 days.

(21) Appl. No.: 10/727,492

(22) Filed: Dec. 5, 2003

(65) Prior Publication Data
US 2004/0181556 A1    Sep. 16, 2004

(30) Foreign Application Priority Data
Mar. 14, 2003  (KR)  .................... 10-2003-0016023

(51) Int. Cl.
*H03M 13/27* (2006.01)
(52) U.S. Cl. ........................................... 714/701
(58) Field of Classification Search ............. 714/701, 714/702
See application file for complete search history.

(56) References Cited

U.S. PATENT DOCUMENTS

| | | | | |
|---|---|---|---|---|
| 5,042,033 A | * | 8/1991 | Costa | 714/701 |
| 5,241,563 A | * | 8/1993 | Paik et al. | 375/262 |
| 5,369,652 A | * | 11/1994 | Bailey et al. | 714/755 |
| 5,537,420 A | * | 7/1996 | Huang | 714/701 |
| 5,559,506 A | * | 9/1996 | Leitch | 340/7.43 |
| 5,592,492 A | * | 1/1997 | Ben-Efraim et al. | 714/702 |
| 5,636,224 A | * | 6/1997 | Voith et al. | 714/701 |
| 5,764,649 A | * | 6/1998 | Tong | 714/701 |
| 5,912,898 A | * | 6/1999 | Khoury | 714/701 |
| 5,928,371 A | * | 7/1999 | Robinson et al. | 714/702 |
| 6,014,761 A | * | 1/2000 | Lachish et al. | 714/702 |
| 6,035,427 A | * | 3/2000 | Kweon | 714/702 |
| 6,138,262 A | * | 10/2000 | Baek | 714/768 |
| 6,178,530 B1 | * | 1/2001 | Aman et al. | 714/702 |
| 6,353,900 B1 | * | 3/2002 | Sindhushayana et al. | 714/701 |
| 6,363,026 B1 | * | 3/2002 | Su et al. | 365/230.01 |
| 6,411,654 B1 | * | 6/2002 | Furutani et al. | 375/262 |
| 6,536,001 B1 | * | 3/2003 | Cai et al. | 714/701 |
| 6,598,202 B1 | * | 7/2003 | Kim et al. | 714/786 |
| 6,670,898 B1 | * | 12/2003 | Lifshitz | 341/81 |
| 6,701,468 B1 | * | 3/2004 | Yamazaki et al. | 714/702 |
| 6,732,316 B1 | * | 5/2004 | Tong et al. | 714/756 |
| 6,785,862 B1 | * | 8/2004 | Zhang | 714/788 |
| 6,854,077 B2 | * | 2/2005 | Chen et al. | 714/702 |
| 7,024,596 B2 | * | 4/2006 | Xin | 714/702 |
| 2003/0070138 A1 | * | 4/2003 | Chow | 714/796 |

FOREIGN PATENT DOCUMENTS

KR    0123088 B1    9/1997

\* cited by examiner

*Primary Examiner*—Stephen M. Baker
(74) *Attorney, Agent, or Firm*—Sughrue Mion, PLLC

(57) ABSTRACT

Disclosed is a deinterleaving apparatus and a method for a digital communication system which can be simply implemented. The deinterleaving apparatus has a row counter for increasing a row counting value based on input data, a column counter for increasing a column counting value every row period set in the row counter, a plurality of synchronous counters corresponding to the row period, and for increasing a synchronous counting value every column period set in the column counter, an offset memory for storing offset values set in correspondence to interleaving delay depths of the input data by channel, and a deinterleaver memory for storing the input data at a write address generated based on the offset value. The input data stored in the deinterleaver memory is read at a read address generated based on the synchronous counting value. Accordingly, simple implementation of the deinterleaving apparatus is enabled.

14 Claims, 7 Drawing Sheets

INVALID DATA     VALID DATA

510

→ WRITE ADDRESS    ---→ READ ADDRESS

DEINTERLEAVING APPARATUS AND METHOD FOR A DIGITAL COMMUNICATION SYSTEM

CROSS-REFERENCE TO RELATED APPLICATIONS

This application claims the benefit of Korean Application No. 2003-16023, filed Mar. 14, 2003, in the Korean Intellectual Property Office, the disclosure of which is incorporated herein by reference.

BACKGROUND

1. Field of the Invention

The present invention relates to a digital communication system, and more particularly to a deinterleaving apparatus and method for a digital communication system which improve reliability against bust errors occurring in transmission environments and simplify implementations thereof.

2. Description of the Related Art

In general, multi-channel digital communication systems use the convolution code in order to eliminate random noise occurring upon transmissions. The convolution code is robust with respect to random noise, but weak on the bust error referring to errors clustered at a certain region. Accordingly, the multi-channel digital communication system converts data streams having bust errors into streams with random errors.

The existing interleaving schemes are mainly classified into the block interleaving scheme and the convolutional interleaving scheme. The convolutional interleaving scheme has difficulties in its implementation compared to the block interleaving scheme, but has an advantage of being implemented in one fourth of the memory size and a half of the total delay time, so that the convolutional interleaving scheme is mainly used in instruments with a large interleaving size.

The interleaver of the convolutional interleaving scheme (i.e., convolutional interleaver) is one that changes input data streams from a certain order to a random order by using an FIFO shift registers having different delay depths. The structures for the interleaver and deinterleaver of the convolutional interleaving scheme are shown in FIG. 1.

The convolutional interleaver 110 is provided with k branches and m-bit FIFO shift registers M. That is, the larger the FIFO shift registers M become, the more the interleaving characteristics are enhanced. The convolutional deinterleaver 120 has the opposite structure to the interleaver 110. By doing so, interleaved data are deinterleaved so that original data is restored.

The structure of a deinterleaver using such FIFO shift registers requires many logic gates, causing a problem of hardware size and complexity. As a technology developed to solve such a problem, the use of random access memories (RAMs) instead of the FIFO shift registers has been proposed.

The use of the random access memories prevents the hardware from becoming large, but it requires additional logic elements to control address generations and memory controls.

That is, in case of carrying out interleaving operations by use of the random access memories, a multi-channel digital broadcast system has a different delay depth for each channel, so that a receiver has to generate a different address according to the delay depth interleaved for each channel. In particular, enlarging interleaved delay depths for the improvement of digital broadcast quality brings out a problem of logic size and complicated implementation that generate an address for each channel.

Further, depending upon deinterleaving operation characteristics, void data of different sizes is attached ahead of valid data for each channel, in accordance with a different interleaved delay depth for each channel. Accordingly, a starting point of valid data by channel becomes asynchronous with a system, causing a problem of additionally implementing synchronization logic elements.

Such a conventional interleaver has a disadvantage that its size becomes large as its structure becomes complicated.

SUMMARY

In an effort to solve the problems described above, it is an aspect of an embodiment of the present invention to provide a deinterleaving apparatus and a method for a digital communication system enhancing reliability and simplifying implementations thereof.

In order to achieve the above aspect and/or other features of the present invention, a deinterleaving apparatus for a digital communication system includes a row counter for increasing a row counting value based on input data, a column counter for increasing a column counting value every row period set in the row counter, plural synchronous counters corresponding to the row period, and for increasing a synchronous counting value every column period set in the column counter, an offset memory for storing offset values set in correspondence to interleaving delay depths of the input data by channel, and a deinterleaver memory for storing the input data at a write address generated based on the offset value. The input data stored in the deinterleaver memory is read at a read address generated based on the synchronous counting value.

Preferably, the plural synchronous counters each have a different synchronous period from each other in correspondence to the row counting value, and a column period set in the column counter corresponds to a synchronous signal of the digital communication system.

The input data includes valid and invalid data depending upon interleaving delay depths by channel, and the valid data is read at the read address generated based on the synchronous counting value.

The read and write addresses are generated in combination of the row counting value, column counting value, and synchronous counting value, and the write address is generated based on the column counting value to which the offset value is added and the synchronous counting value.

According to an embodiment of the present invention, a deinterleaving method for a digital communication system includes steps of increasing a row counting value of a row counter based on input data, increasing a column counting value of a column counter every row period set in the row counter, increasing synchronous counting values of plural synchronous counters in every column period set in the column counter, storing in a deinterleaver memory the input data at a write address generated based on offset values set in correspondence to interleaving delay depths of the input data by channel, and reading the input data stored in the deinterleaver memory at a read address generated based on the synchronous counting values.

Plural row and column counters, which are necessary for the respective channels, are substituted by a single row counter and a single column counter, and as a result, constructions can be simplified. Further, by synchronizing the periods of row counter with the synchronous signal of a system, deinterleaving data, which are synchronized for each channel, can be obtained.

BRIEF DESCRIPTION OF THE DRAWINGS

The invention will be described in detail with reference to the following drawings in which like reference numerals refer to like elements, and wherein.

DETAILED DESCRIPTION OF THE EXEMPLARY EMBODIMENTS

Hereinafter, the present invention will be described in detail with reference to 20 the accompanying drawings.

Figure 2:
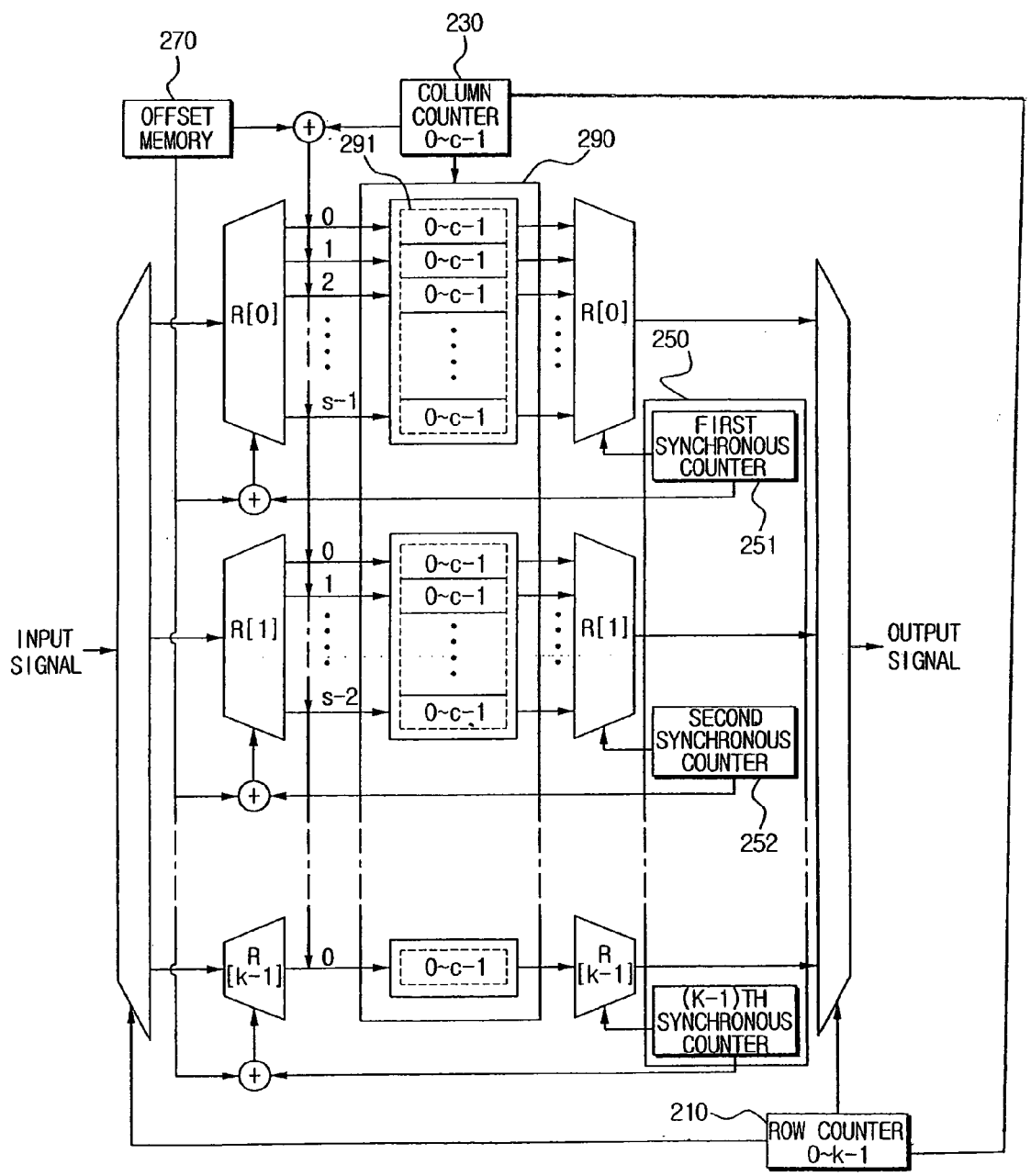
FIG. 2 is a view for schematically showing a structure of a deinterleaving apparatus for a digital communication system according to an embodiment of the present invention.

FIG. 2 is a view for schematically showing a deinterleaving apparatus for a digital communication system according to an embodiment of the present invention. The deinterleaving apparatus has a row counter 210, a column counter 230, plural synchronous counters 250, an offset memory 270, and a deinterleaver memory 290. Further, plural multiplexers are provided. The multiplexers each perform switching operations of selectively switching input signals for an output.

The deinterleaver memory 290 has memory cells 291 each having c columns corresponding to a synchronous signal, and the memory cells 291 are arranged in k rows wherein k is at least one or more. Accordingly, an address system is configured with a combination of a row counting value, a column counting value, and a counting value, that is, synchronous counting value of the memory cells 291.

The row counter 210 is a ring counter counting k rows, that is, R[0] to R[k−1], and increases a row counting value in the order of input data.

The column counter 230 is a ring counter counting c columns, that is, 0 to c−1, of the memory cell 291, and, if the row counter 210 completes counting up to k−1, increases a counting value of the column counter 230. The value of c is a value set in correspondence to a synchronous signal of a system.

k synchronous counters 250 are provided, and the first through (k−1)th synchronous counters 251, 252, . . . each count one or more memory cells 291 arranged in k rows R[0] to R[k−1]. That is, the synchronous counter 250 increases a counting value thereof if the column counter 230 completes counting up to c−1 as a counting value thereof.

For example, the first through (k−1)th synchronous counters 251, 252 . . . each have a repetitive period as follows in accordance with deinterleaving operation characteristics.

That is, the first synchronous counter 251 of row R[0] has a repetitive period of s, the second synchronous counter 252 of row R[1] has a repetitive period of s−1, and, in the same manner, the k−1 synchronous counter of row R[k−1] has a repetitive period of 1.

The offset memory 270 stores offset values corresponding to interleaving delay depths by channel.

Figure 1:
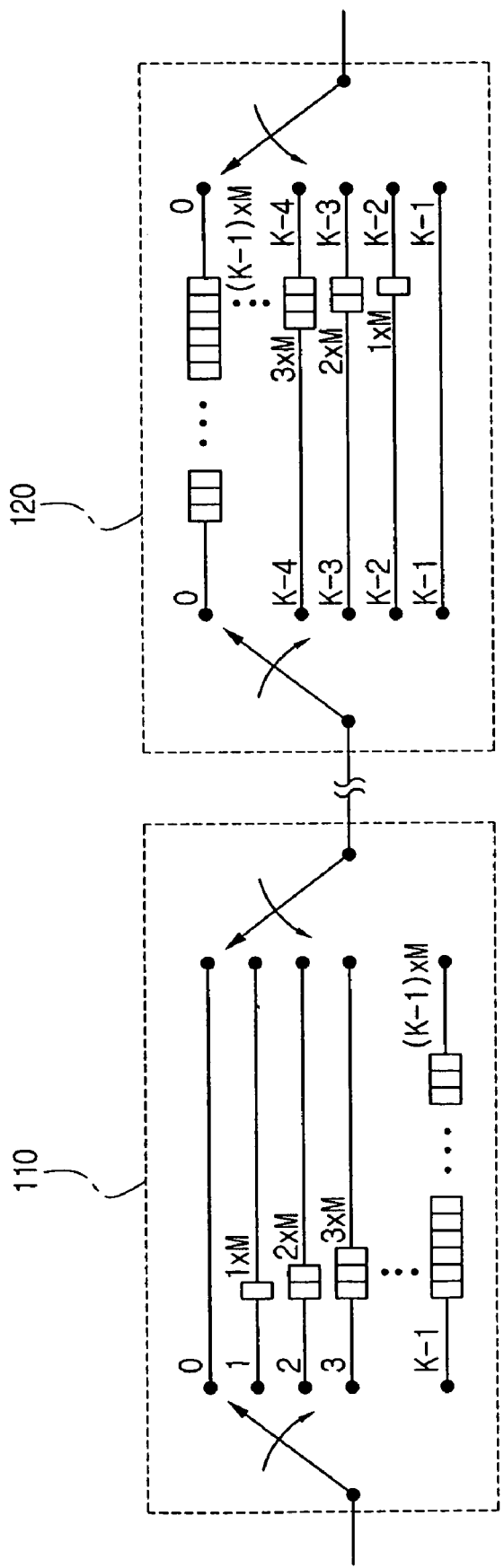
FIG. 1 is a view for schematically showing structures of conventional interleaving and deinterleaving apparatuses.

In the offset values, when referring to the deinterleaver 120 of FIG. 1, an offset value of R[1] can be expressed in Formula 1 as follows:

$$\text{offset}=(k-1)M-[(k-1)M-(K-2)M] \qquad \text{[Formula 1]}$$

That is, an offset value stored in advance is added to a column counting value and a synchronous counting value so that write addresses for input data by channel are generated.

Figure 3:
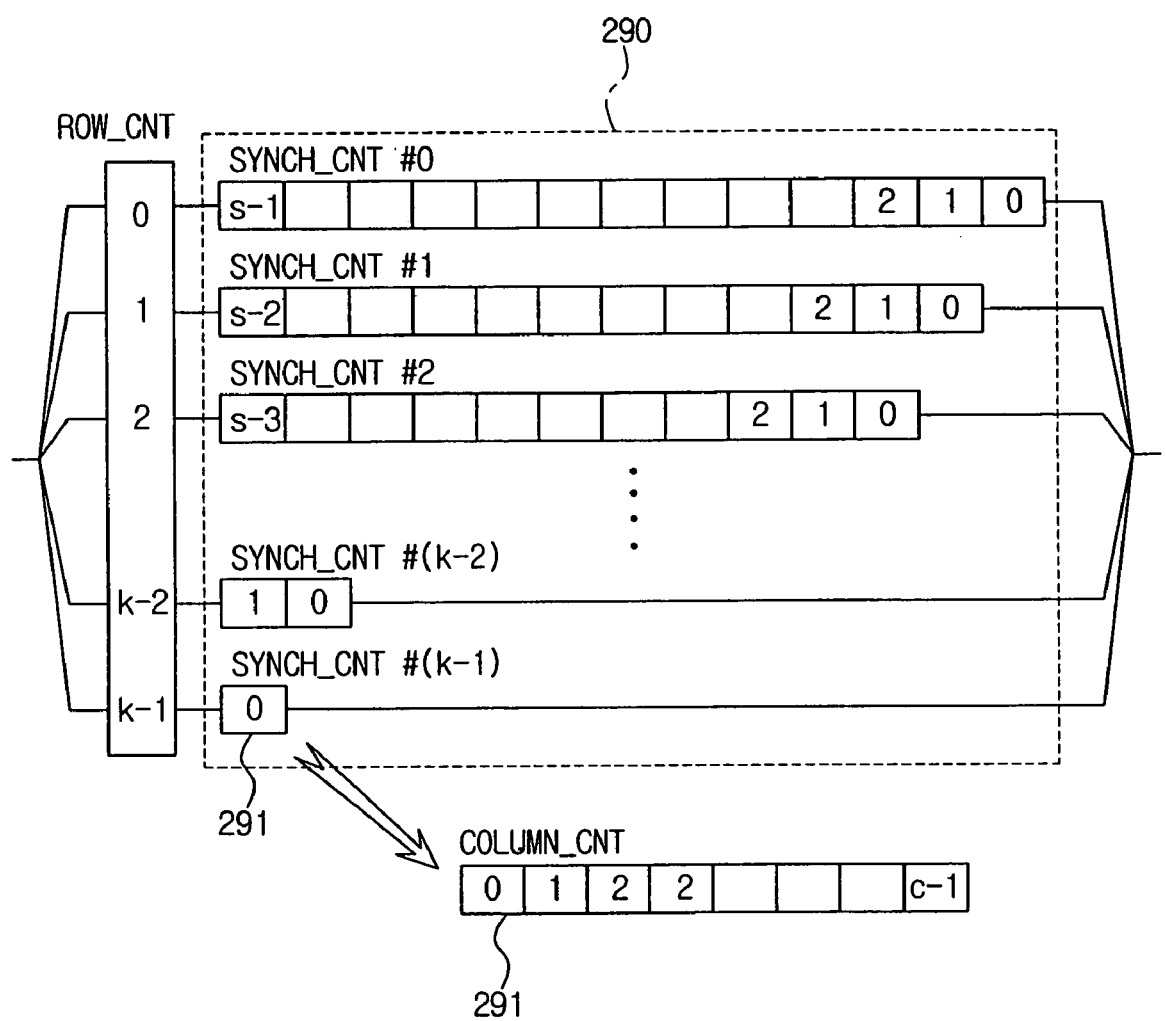
FIG. 3 is a view for conceptually showing a structure of the deinterleaving apparatus of FIG. 2.

FIG. 3 is a view for conceptually explaining the deinterleaving apparatus of FIG. 2.

The deinterleaving apparatus has the same row counter 210 and column counter 230 for multiple channels. The row counter 210 counts rows R[0] to R[k−1], and the column counter 230 counts columns [0] to [c−1] forming one memory cell 291. The k rows R[0] to R[k−1] have at least one or more memory cells 291 in correspondence to interleaving delay depths. For example, R[0] has s(0~s−1) memory cells, R[1] has s−1(0~s−2) memory cells, . . . , R[k−1] has 1(0) memory cells.

The counters 210, 230, and 250 each have the operations as follows.

That is, if the row counter 210 has a row counting value Row_CNT reached to k−1, the column counter 230 increases a column counting value Column_CNT by 1, and, if the column counter 230 has a column counting value Column_CNT reached to c−1, the synchronous counter 250 increases a synchronous counting value Row_CNT by 1. As such, write and read addresses for the deinterleaver memory 290 are generated in combination of the column counting value Row_CNT, column counting value Column_CNT, and synchronous counting value synch_CNT counted by the respective counters 210, 230, and 250.

First, a write address is generated by adding an offset value O by channel stored 10 in the offset memory 270 to the column counting value Column_CNT and the synchronous counting value Synch_CNT.

Thereafter, the write address is generated in combination of the row counting values Row_CNT and the column counting value Column_CNT based on the synchronous counting value Synch_CNT.

Figure 4A:
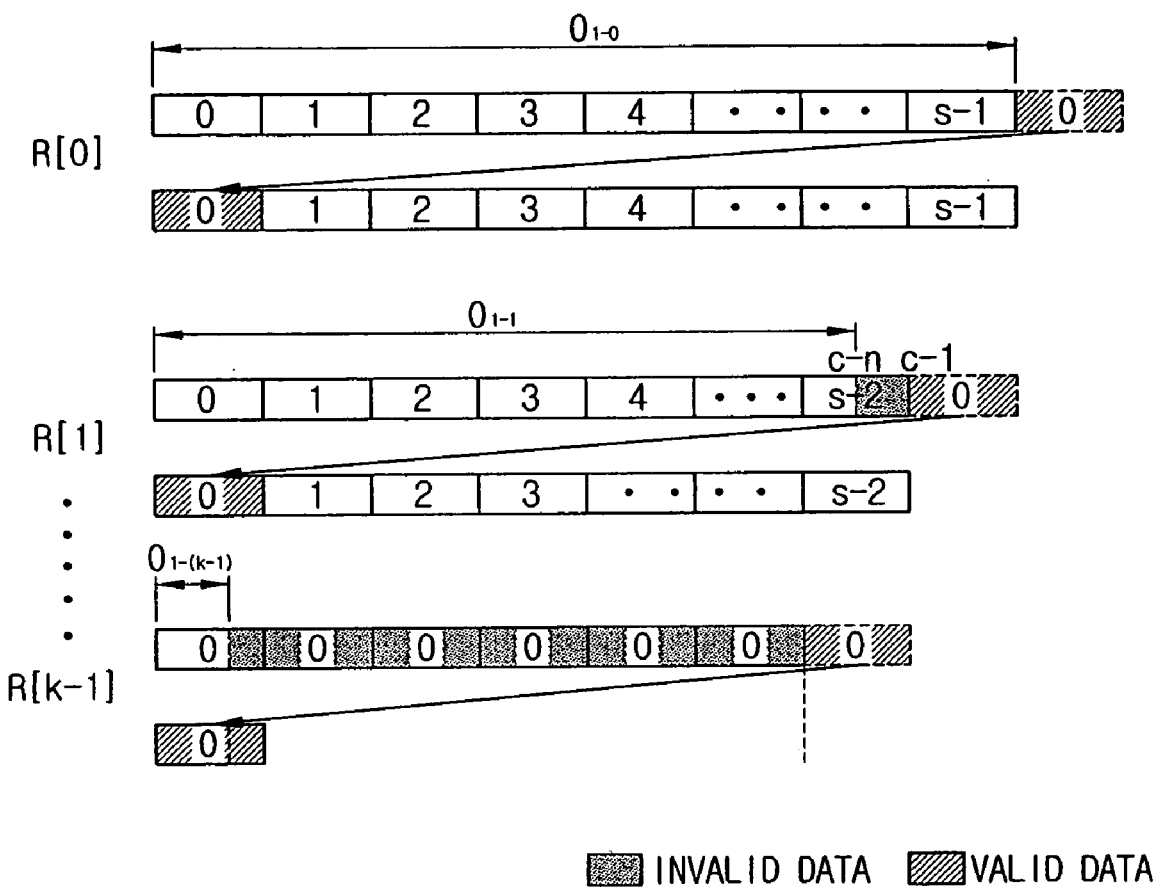
FIG. 4A and FIG. 4B are views for explaining a process for input data to be written into a deinterleaver memory at write addresses generated by offset values set in the deinterleaving apparatus of FIG. 2.
Figure 4B:
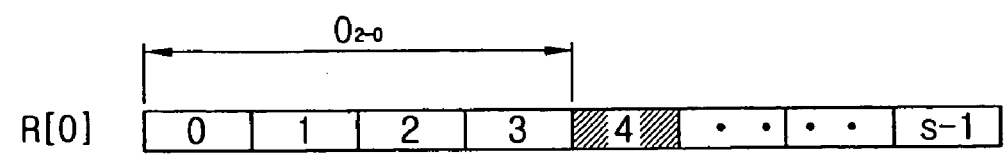
Figure 4B:
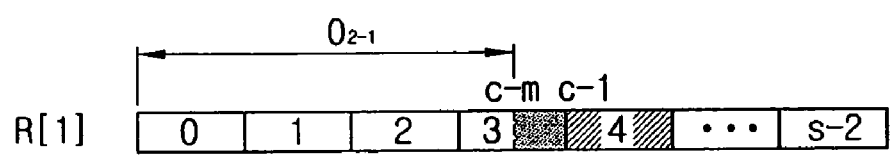
Figure 4B:
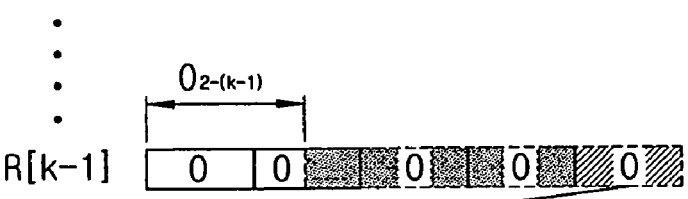
Figure 4B:

FIG. 4A and FIG. 4B is a view for explaining a process through which the write addresses Row_CNT, Column_CNT, and Synch_CNT are generated by offset values $O_1$ and $O_2$ by channel with input data pre-set.

First, FIG. 4A is for a first channel having the biggest interleaving delay depth out of inputted multi-channel data.

Valid data is inputted for the first input data of the first channel according to an interleaving result, and the first data is used for a write address (0,0,0) corresponding to an offset value $O_{1-0}$ of the row R[0].

Invalid data is inputted for the second input data according to an interleaving result, and the second data is used for a write address (1, c−n, s−2) corresponding to an offset value $O_{1-1}$ of the R[1]. That is, invalid data generated in an interleaving process is used for the write addresses from (1, c−n, s−2) to (1, c−1, s−2), and valid data is used from a write address (1, 0, 0).

As above, valid data is first used for input data from a region with the synchronous counting value Synch_CNT of '0' with respect to the respective rows R[0], R[1], . . . , R[k−1] based on the offset value $O_1$ of the first channel stored in the offset memory 270 in advance.

Accordingly, a read address for the first channel is generated by adding the row counting value Row_CNT and the column counting value column_CNT based on the synchronous counting value Synch_CNT of '0', so that deinterleaving data of the first channel is outputted in synchronization.

FIG. 4B is for a second channel having an interleaving delay depth smaller than that of the first channel.

Valid data is inputted for the first input data of the second channel according to an interleaving result, and a write address (0,0,4) is used for the first data in correspondence to an offset value O2-0 of the row R[0].

Invalid data is inputted for the second input data according to an interleaving result, and a write address (1, c−m, 3) is used for the second data in correspondence to an offset value $O_{2-1}$ of the R[1]. That is, invalid data generated in an interleaving process is used for the write addresses from (1, c−m, 3) to (1, c−1, 3), and valid data is used from a write address (1, 0, 4).

As aforementioned, valid data is first written for input data from a region with the synchronous counting value Synch_CNT of '4' with respect to the respective rows R[0], R[1], . . . , R[k−1] based on the offset value $O_2$ of the second channel stored in the offset memory 270 in advance.

Accordingly, a read address for the second channel is generated in combination of the row counting value Row_CNT and the column counting value Column_CNT based on the synchronous counting value Synch_CNT of '4', so the deinterleaving data of the second channel is outputted in synchronization.

As described above, according to the present invention, input data of multiple channels which has different interleaving delay depths can be outputted as deinterleaving data in synchronization by channel.

Figure 5A:
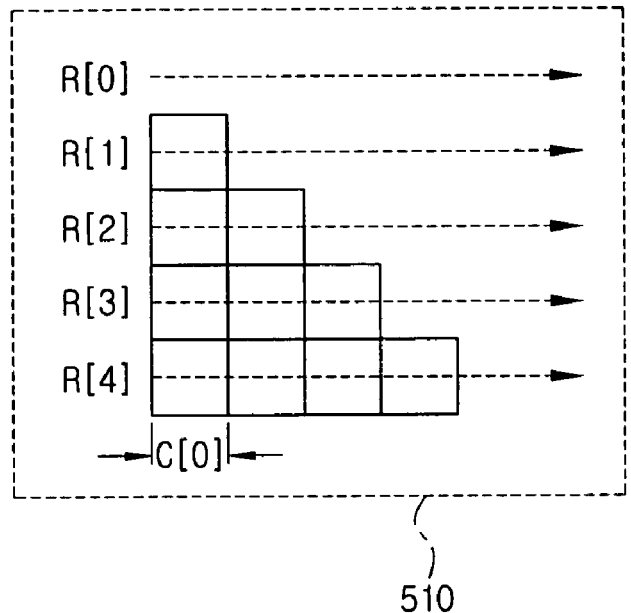
FIG. 5A and FIG. 5B are views for illustrating a process carrying out deinterleaving operations of a deinterleaving apparatus according to an embodiment of the present invention.
Figure 5B:
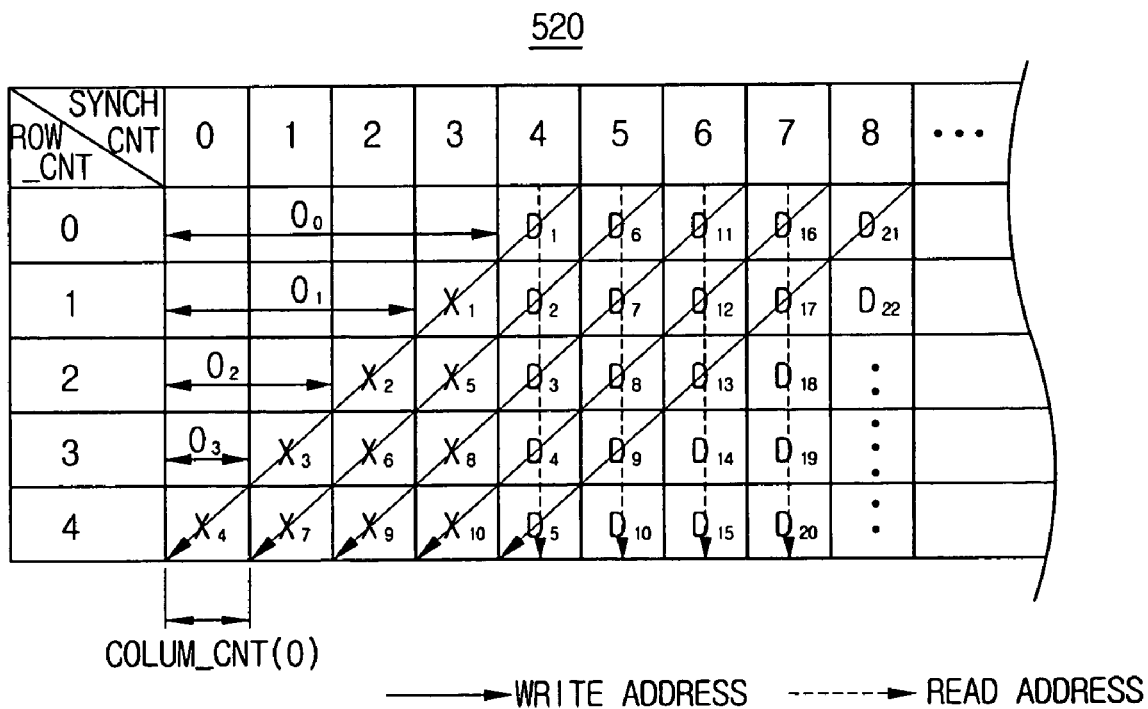
Figure 6A:
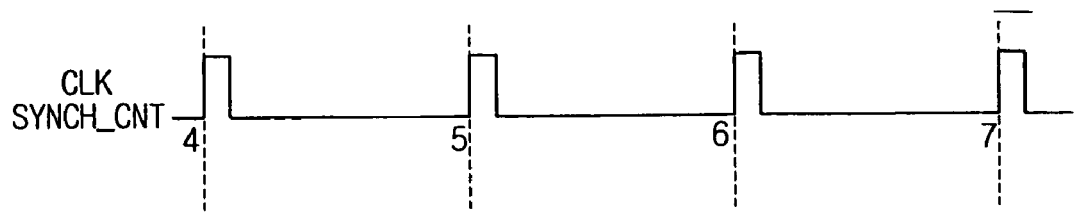
FIG. 6A and FIG. 6B are timing diagrams for a synchronous signal and an output signal for a deinterleaving apparatus according to an embodiment of the present invention.
Figure 6B:
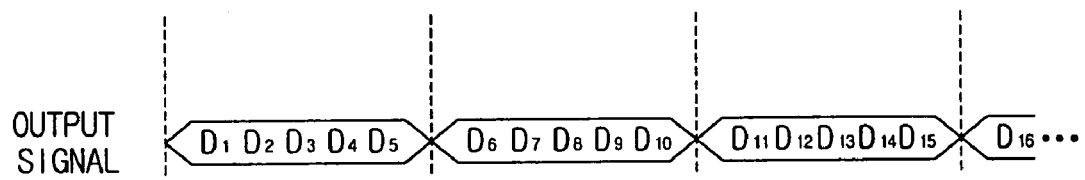
Figure 7:
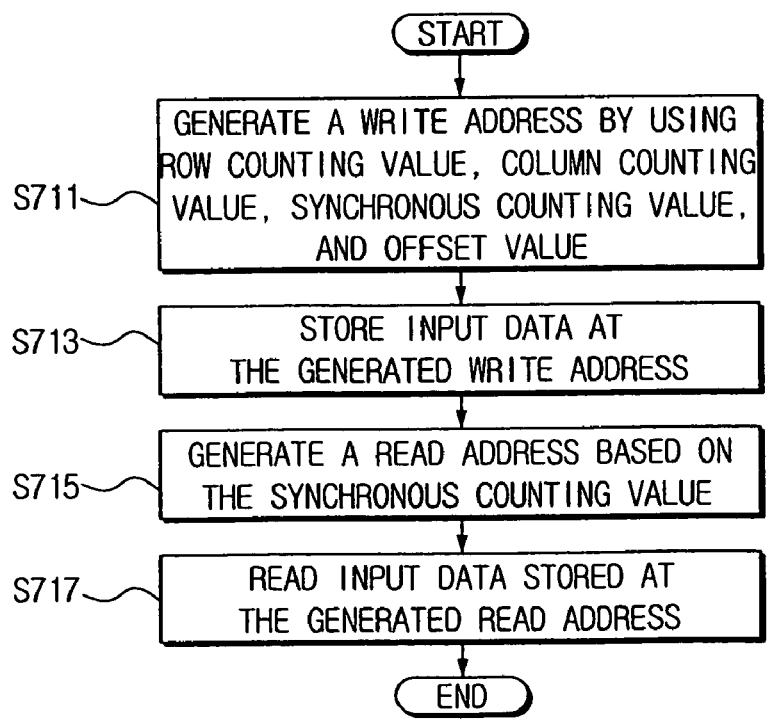
FIG. 7 is a flow chart for explaining a deinterleaving method for a digital communication system according to an embodiment of the present invention.

FIG. 5A, FIG. 5B, FIG. 6A, and FIG. 6B are exemplary views for explaining a deinterleaving process of a deinterleaving apparatus according to an embodiment of the present invention, and FIG. 7 is a flow chart for showing the deinterleaving process. Hereinafter, the deinterleaving process will be described in detail with reference to FIG. 5A to FIG. 7.

FIG. 5A is a view for showing an interleaving apparatus 510 having five rows 20 R[0], R[1], R[2], R[3], and R[4] and one column C[0].

First, data inputted to the interleaving apparatus 510 is as follows:

[Table 1]

$X_1, X_2, X_3, X_4, \ldots$, become invalid data generated in the interleaving process.

An interleaver memory 520 has five rows R(0)(1)(2)(3)(4) and one column C(0) corresponding to the interleaving apparatus 510. Further, it is assumed that synchronous counting values have values from 0 to s−1 in case of R(0).

FIG. 5B is a view for explaining a process through which interleaving data shown in Table 2 is written in the deinterleaver memory 520

First, write addresses are generated by using offset values $O_0, O_1, O_2, \ldots$, set in advance in correspondence to the interleaving apparatus 510.

The offset value O, according to Formula 1 explained as above, is obtained by subtracting a corresponding delay depth R[0] from the biggest delay depth R[0], and then subtracting the difference of the above subtraction from the biggest delay depth R[0]. Since the repetitive period of a column counter is 1, the M in Formula 1 becomes '1'.

That is, offset values O stored in the offset memory 270 of the deinterleaving apparatus is as follows.

$(4\times1)-[(4\times1)-(4\times1)]=4$ for the offset value $O_0$ of row R(0), $(4\times1)-[(4\times1)-(3\times1)]=3$ for the offset value $O_1$ of row R(1), $(4\times1)-[(4\times1)-(2\times1)]=2$ for the offset value $O_2$ of row R(2), $(4\times1)-[(4\times1)-(1\times1)]=1$ for the offset value $O_3$ of row R(3), and $(4\times1)-[(4\times1)-(0\times1)]=0$ for the offset value $O_4$ of row R(4).

As above, write addresses are generated based on the offset values O stored in advance in the offset memory 270, and a process through which the input data in Table 2 is written in the deinterleaver memory 520 is shown in FIG. 5B.

Referring to Table 2, if a first input data D1 is inputted, a write address (0, 0, 4) is generated by using a row counting value Row_CNT, a column counting value Column_CNT, a synchronous counting value Synch_CNT, and an offset value $O_0$ (S711). Accordingly, data D1 is written in the write address (0, 0, 4) of the deinterleaver memory 520 (S713). Likewise, second data X1 is used for a write address (1, 0, 3), third data X2 is used for a write address (2, 0, 2), fourth data X3 is used for a write address (3, 0, 1), and fifth data X4 is used for a write address (4, 0, 0). Remaining interleaving data in Table 2 is used for corresponding addresses of the deinterleaver memory 520 in the same manner.

TABLE 1

| | Time | | | | | | | | | | | | | | | | | |
|---|---|---|---|---|---|---|---|---|---|---|---|---|---|---|---|---|---|---|
| | t1 | t2 | t3 | t4 | t5 | t6 | t7 | t8 | t9 | t10 | t11 | t12 | t13 | t14 | t15 | t16 | t17 | ... |
| Data | D1 | D2 | D3 | D4 | D5 | D6 | D7 | D8 | D9 | D10 | D11 | D12 | D13 | D14 | D15 | D16 | D17 | ... |

If the data of Table 1 is inputted to the interleaving apparatus 510, data interleaved in and outputted out of the interleaving apparatus 510 is as follows:

TABLE 2

| | Time | | | | | | | | | | | | | | | | | |
|---|---|---|---|---|---|---|---|---|---|---|---|---|---|---|---|---|---|---|
| | t1 | t2 | t3 | t4 | t5 | t6 | T7 | t8 | t9 | t10 | t11 | t12 | t13 | t14 | t15 | t16 | t17 | ... |
| Data | D1 | X1 | X2 | X3 | X4 | D6 | D2 | X5 | X6 | X7 | D11 | D7 | D3 | X8 | X9 | D16 | D12 | ... |

Accordingly, data is sequentially written from a region having a synchronous counting value Synch_CNT of '4' with respect to respective rows R(0), R(1), R(2), R(3), and R(4) of the deinterleaver memory 520.

As above, with data written in the deinterleaver memory 520, read addresses are generated based on the synchronous counting value Synch_CNT of '4' (S715). That is, generated are read addresses such as (0,0,4)(1,0,4)(2,0,4)(3,0,4)(4,0,4), (0,0,5)(1,0,5)(2,0,5)(3,0,5)(4,0,5),(0,0,6)(1,0,6)(2,0,6)(3,0,6)(4,0,6), . . . , and, according to the generated read addresses, data (D1,D2,D3,D4,D5), (D6,D7,D8,D9, D10), . . . , are read (S717).

Accordingly, invalid data X1, X2, X3, X4, . . . , generated upon interleaving is not generated, and input data is deinterleaved and outputted in order.

FIG. 6A is a timing view of a system synchronous signal CLK, and FIG. 6B is a timing view for an output signal of data read from the deinterleaver memory 520 based on the synchronous counting value Synch_CNT.

As shown in FIG. 6A and FIG. 6B, data (D1, D2, D3, D4, D5) are read in synchronization with a system synchronous signal when Synch_CNT=4.

In the manner as above, in synchronization with the synchronous counting value (Synch_CNT=4, 5, 6, . . . ), that is, a synchronous signal, data (D6, D7, D8, D9, D10), (D11, D12, D13, D14, D15), . . . are read from the deinterleaver memory 520 and then deinterleaved.

According to the present invention, because the plural row and column counters, which are required for the respective channels, are substituted by a single row counter and a single column counter, the construction is simplified. Further, by synchronizing a period of the column counter with a system synchronous signal, deinterleaving data which are synchronized for the respective channels can be obtained. Therefore, any additional synchronization logic configuration for synchronization of deinterleaving data for the channels is not so necessary and as a result, the overall construction becomes simplified.

According to the present invention, first, a deinterleaving apparatus can be simply implemented since the number of counters is minimized and any additional logic for synchronization is unnecessary.

Second, by synchronizing a period of a column counter with a synchronous signal, deinterleaving data synchronized by channel can be obtained.

Third, according to the minimum number of counters, the implementation of an apparatus for generating read and write addresses can also be simplified.

While the invention has been shown and described with reference to a certain exemplary embodiment thereof, it will be understood by those skilled in the art that various changes in form and details may be made therein without departing from the spirit and scope of the invention as defined by the appended claims.

What is claimed is:

1. A deinterleaving apparatus for a digital communication system, comprising:
   a row counter which increases a row counting value for a row period based on input data;
   a column counter which increases a column counting value for a column period for each row counting value set in the row counter;
   plural row synchronous counters each corresponding to a different row counting value, and which each increase a synchronous counting value corresponding to the row counting value through each column period set in the column counter;
   an offset memory which stores offset values set in correspondence to interleaving delay depths of the input data for each channel; and
   a deinterleaver memory which stores the input data at a write address generated based on the offset values, wherein the input data stored in the deinterleaver memory is read at a read address generated based on the synchronous counting value.

2. The deinterleaving apparatus as claimed in claim 1, wherein the plural row synchronous counters each have a different synchronous period from each other.

3. The deinterleaving apparatus as claimed in claim 1, wherein a column period set in the column counter corresponds to a synchronous signal of the digital communication system.

4. The deinterleaving apparatus as claimed in claim 1, wherein the input data includes valid and invalid data depending upon interleaving delay depths for each channel, and the valid data is read at the read address generated based on the synchronous counting value corresponding to the row counting value.

5. The deinterleaving apparatus as claimed in claim 1, wherein the read and write addresses are generated based on the row counting value, the column counting value, and the synchronous counting value corresponding to the row counting value.

6. The deinterleaving apparatus as claimed in claim 1, wherein the write address is generated based on a sum of the column counting value and the offset value, and the synchronous counting value corresponding to the row counting value.

7. The deinterleaving apparatus as claimed in claim 1, further comprising plural multiplexers for selectively switching, so as to output a signal for writing and reading with respect to the deinterleaver memory.

8. A deinterleaving method for a digital communication system, comprising steps of:
   increasing a row counting value of a row counter based on input data;
   increasing a column counting value of a column counter for each row counting value set in the row counter;
   increasing synchronous counting values of each of plural row synchronous counters through every column period set in the column counter;
   storing in a deinterleaver memory the input data at a write address generated based on offset values set in correspondence to interleaving delay depths of the input data for each channel; and
   reading the input data stored in the deinterleaver memory at a read address generated based on the synchronous counting values,
   wherein each plural row synchronous counter corresponds to a different row counting value.

9. The deinterleaving method as claimed in claim 8, wherein the plural row synchronous counters each have a different synchronous period from each other.

10. The deinterleaving method as claimed in claim 8, wherein a column period set in the column counter corresponds to a synchronous signal of the digital communication system.

11. The deinterleaving method as claimed in claim 8, wherein the input data includes valid and invalid data depending upon interleaving delay depths for each channel, and, in the data-reading step, the valid data is read for an output at the read address generated based on the synchronous counting value corresponding to the row counting value.

12. The deinterleaving method as claimed in claim 8, wherein the read and write addresses are based on the row counting value, the column counting value, and the synchronous counting value corresponding to the row counting value.

13. The deinterleaving method as claimed in claim 8, wherein the write address is generated based on a sum of the column counting value and the offset value, and the synchronous counting value corresponding to the row counting value.

14. The deinterleaving method as claimed in claim 8, wherein each step further includes a step for selectively outputting a signal with respect to a predetermined input signal.

* * * * *